United States Patent
Ha et al.

(10) Patent No.: US 10,475,854 B2
(45) Date of Patent: Nov. 12, 2019

(54) MANUFACTURING METHOD OF DISPLAY DEVICE AND THIN-FILM DEPOSITION APPARATUS USING THE SAME

(71) Applicant: Samsung Display Co., Ltd., Yongin-si, Gyeonggi-do (KR)

(72) Inventors: Heon Sik Ha, Osan-si (KR); Kwang Hyun Kim, Ansan-si (KR); Sang Wook Lee, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 15/836,285

(22) Filed: Dec. 8, 2017

(65) Prior Publication Data
US 2018/0269259 A1 Sep. 20, 2018

(30) Foreign Application Priority Data
Mar. 15, 2017 (KR) .......................... 10-2017-0032623

(51) Int. Cl.
*H01L 27/32* (2006.01)
*H01L 51/56* (2006.01)
*H01L 51/52* (2006.01)

(52) U.S. Cl.
CPC ............ *H01L 27/32* (2013.01); *H01L 27/323* (2013.01); *H01L 51/5253* (2013.01); *H01L 51/56* (2013.01); *H01L 2251/562* (2013.01)

(58) Field of Classification Search
CPC ... H01L 27/32; H01L 27/323; H01L 51/5253; H01L 51/56; H01L 2251/562
See application file for complete search history.

(56) References Cited

U.S. PATENT DOCUMENTS

| | | | |
|---|---|---|---|
| 2008/0014761 A1* | 1/2008 | Bhatia | H01L 21/0332 438/769 |
| 2014/0307144 A1* | 10/2014 | Jeong | H04N 5/232 348/333.06 |
| 2015/0064456 A1* | 3/2015 | Kimura | G02B 1/105 428/336 |
| 2015/0130726 A1* | 5/2015 | Min | G06F 3/0412 345/173 |
| 2015/0333293 A1 | 11/2015 | Poon et al. | |

FOREIGN PATENT DOCUMENTS

| | | |
|---|---|---|
| KR | 101114219 B1 | 2/2012 |
| KR | 1020140064395 A | 5/2014 |
| KR | 1020140069708 A | 6/2014 |
| KR | 1020140073714 A | 6/2014 |

OTHER PUBLICATIONS

A highly adhesive siloxane LED encapsulant optimized for high thermal stability and optical efficiency; J. Mater. Chem. C 2016, 4, 10791 (Year: 2016).*

Advances in Light Curing Adhesives; Presented at SPIE, San Diego, CA, Aug. 1, 2001 (Year: 2001).*

Housei Akazawa, "Radiation effects in vacuum-ultraviolet-irradiated SiNx:H films", Nuclear Instruments and Methods in Physics Research B-116 (1996) 355-359.

* cited by examiner

*Primary Examiner* — Syed I Gheyas
(74) *Attorney, Agent, or Firm* — Cantor Colburn LLP

(57) ABSTRACT

A method of manufacturing a display device, including: providing a display element layer on a substrate; forming a thin film encapsulation layer covering the display element layer; aging the thin film encapsulation layer by using a light source emitting artificial sunlight; and forming a window on the aged thin film encapsulation layer.

18 Claims, 16 Drawing Sheets

MANUFACTURING METHOD OF DISPLAY DEVICE AND THIN-FILM DEPOSITION APPARATUS USING THE SAME

This application claims priority to and the benefit of Korean Patent Application No. 10-2017-0032623 filed in the Korean Intellectual Property Office on Mar. 15, 2017, and all the benefits accruing therefrom under 35 U.S.C. § 119, the content of which in its entirety is incorporated herein by reference.

BACKGROUND (a) Technical Field

The present disclosure relates to a method of manufacturing a display device and a thin film deposition apparatus using the same.

(b) Description of the Related Art

Although display devices such as a television and a computer monitor have been developed, the use of small display devices such as a tablet PC and a laptop PC has rapidly increased with the advent of smart phones. Since small display devices are easily portable, they may be used anywhere. Therefore, a user may use the small display device even while the user is moving, for example, during outdoor activities. However, durability of the small display device may deteriorate due to the generation of heat which occurs with use over a long period of time. In particular, as the display device is increasingly used outside, a case in which a display portion of the display device deteriorates due to exposure to natural light and is damaged is also increasing. When the display portion of the display device is deteriorated, since its visibility is degraded, the display device may be functionally seriously damaged. Accordingly, it would be desirable to develop a display device including a display portion which is not deteriorated regardless of whether outdoor activity occurs for an extended period of time, and for which durability is improved.

The above information disclosed in this Background section is only for enhancement of understanding of the background of the invention and therefore it may contain information that does not form the prior art.

SUMMARY

The present disclosure has been made to provide a method of manufacturing a display device and a thin film deposition apparatus using the same that does not deteriorate even when used outdoors for a long time.

An exemplary embodiment of the present disclosure provides a method of manufacturing a display device, including: providing a display element layer on a substrate; forming a thin film encapsulation layer covering the display element layer; aging the thin film encapsulation layer by using a light source emitting artificial sunlight; and disposing a window on the aged thin film encapsulation layer.

The method of manufacturing the display device may further include: disposing a touch unit between the aged thin film encapsulation layer and the window; and forming an insulating layer covering the touch unit, wherein the insulating layer is disposed between the touch unit and each of the window and the aged thin film encapsulation layer, wherein the window may be formed on the insulating layer.

The artificial sunlight may include infrared light, visible light, and ultraviolet light.

The display element layer may include a plurality of pixels including a blue pixel, a red pixel, and a green pixel, and the blue pixel may emit light having a wavelength of 450 nanometer (nm).

After the aging process, transmittance of the aged thin film encapsulation layer at a wavelength of 450 nm may be increased by about 5 percent (%) to about 10% as compared with a transmittance of the thin film encapsulation layer before the aging process.

After the aging process, a refractive index of the aged thin film encapsulation layer at a wavelength of 450 nm may be increased by about 0.02 to about 0.10 as compared with a refractive index of the thin film encapsulation before the aging process.

After the aging process, an extinction coefficient of the thin film encapsulation layer at the wavelength of 450 nm may be increased by about 0.0001 to about 0.0010 as compared with an extinction coefficient of the thin film encapsulation layer before the aging process.

After the aging process, a thickness of the aged thin film encapsulation layer at a wavelength of 450 nm may be increased by about 5 angstroms (Å) to about 10 Å as compared with thickness of the thin film encapsulation before the aging process.

The thin film encapsulation layer may include a $SiN_x$.

In the thin film encapsulation layer after the aging process, a peak area of a Si—N bond as measured by Fourier transform-infrared spectroscopy may be reduced as compared with a peak area of a N—H bond.

In the thin film encapsulation layer after the aging process, a peak area of a Si—N bond as measured by Fourier transform-infrared spectroscopy may be reduced as compared with a peak area of a Si—H bond.

In the thin film encapsulation layer after the aging process, a peak area of a Si—N bond as measured by Fourier transform-infrared spectroscopy may be reduced as compared with a peak area of a Si—NH bond.

Another embodiment of the present disclosure provides a thin film deposition apparatus including: a plurality of chambers, wherein one of the plurality of chambers may be an entry and exit chamber through which a substrate enters from outside of the thin film deposition apparatus, and at least one of the plurality of chambers may be a process chamber, which is configured to deposit a thin film on the substrate; and a light source coupled to any one of the plurality of chambers, and configured to irradiate artificial sunlight on a deposited thin film to age the deposited thin film.

The light source may be coupled to the entry and exit chamber.

One of the plurality of chambers may be an aging chamber to which the light source is coupled, and which is configured to age the deposited thin film.

The light source may emit artificial sunlight including infrared light, visible light, and ultraviolet light.

The process chamber may be a plurality of process chambers.

According to the embodiment of the present disclosure, by aging a thin film encapsulation layer in advance during a process of manufacturing a display device, it is possible to prevent the thin film encapsulation layer of the display device from deteriorating when exposed to natural light during actual use of the display device, and from causing a color difference. Accordingly, it is possible to provide a method of manufacturing a display device in which deterioration of the display device is prevented, even when it is used in an outdoor environment for a long period of time, and to provide a thin film deposition apparatus using the method.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
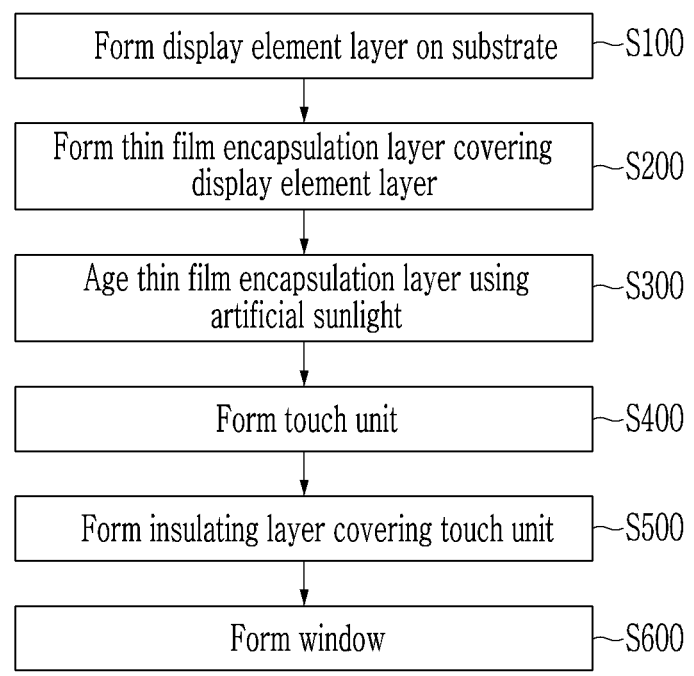
FIG. 1 is a flowchart of a method of manufacturing a display device according to an exemplary embodiment.

Hereinafter, exemplary embodiments of the present disclosure will be described in detail with reference to the accompanying drawings. In describing the present disclosure, a description of known functions or configurations will be omitted so as to make the subject matter of the present disclosure more clear.

To clearly describe the present disclosure, portions which do not relate to the description are omitted, and like reference numerals designate like elements throughout the specification. The size and thickness of each component shown in the drawings are arbitrarily shown for better understanding and ease of description, but the present disclosure is not limited thereto.

In the drawings, the thickness of layers, films, panels, regions, etc., are exaggerated for clarity. For better understanding and ease of description, the thickness of some layers and areas is exaggerated. It will be understood that when an element such as a layer, film, region, or substrate is referred to as being "on" another element, it can be directly on the other element or intervening elements may also be present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Figure 2:
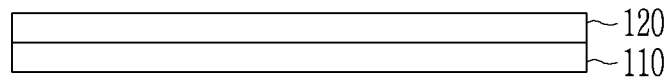
FIG. 2 is a cross-sectional view of a display element layer formed on a substrate.
Figure 3:
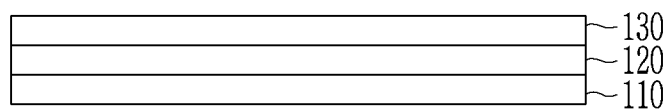
FIG. 3 is a cross-sectional view which illustrates a thin film encapsulation layer covering a display element layer.
Figure 4:
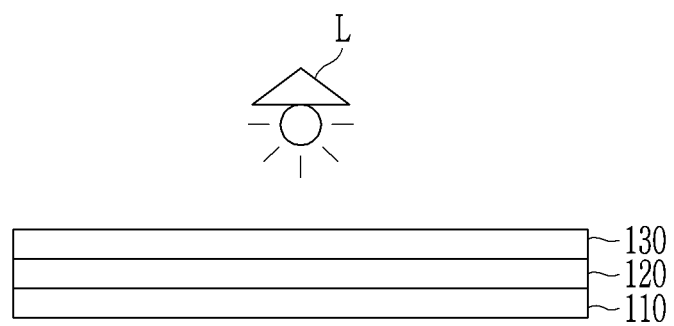
FIG. 4 is a schematic illustration of a state of aging a thin film encapsulation layer using a light source emitting artificial sunlight.
Figure 5:
FIG. 5 is a cross-sectional view which illustrates a thin film encapsulation layer completely aged by a light source emitting artificial sunlight.
Figure 6:
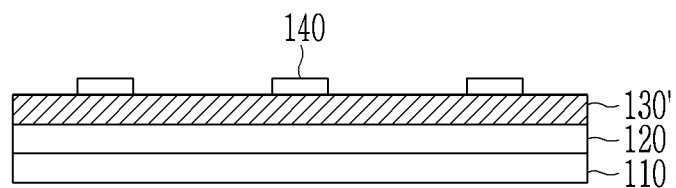
FIG. 6 is a cross-sectional view which illustrates a state in which a touch unit is formed on a thin film encapsulation layer.
Figure 7:
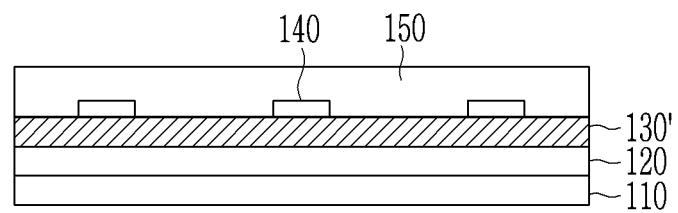
FIG. 7 is a cross-sectional view which illustrates a state in which an insulating layer covering a touch unit is formed.
Figure 8:
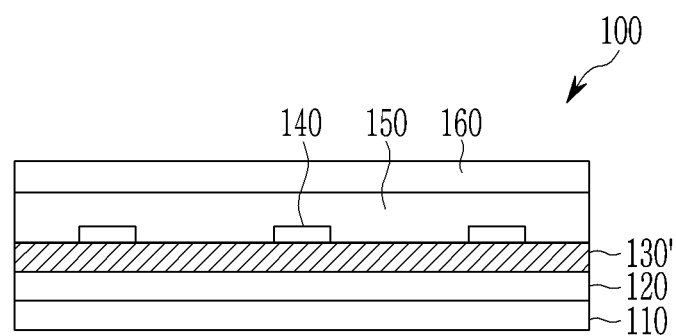
FIG. 8 is a cross-sectional view which illustrates a state in which a window is formed.

First, a manufacturing method of a display device according to an exemplary embodiment of the present disclosure will be described with reference to FIG. 1 to FIG. 8. FIG. 1 is a flow chart of a method of manufacturing a display device according to an exemplary embodiment. FIG. 2 is a cross-sectional view of a state in which a display element layer is formed on a substrate, and FIG. 3 is a cross-sectional view of a state in which a thin film encapsulation layer covering a display element layer is formed. FIG. 4 is a cross-sectional view of a state of aging a thin film encapsulation layer by using a light source emitting artificial sunlight, FIG. 5 is a cross-sectional view of a thin film encapsulation layer completely aged by a light source emitting artificial sunlight, and FIG. 6 is a cross-sectional view of a state in which a touch unit is formed on a thin film encapsulation layer. FIG. 7 is a cross-sectional view of a state in which an insulating layer covering a touch unit is formed, and FIG. 8 is a cross-sectional view of a state in which a window is formed.

Referring to FIG. 1 to FIG. 8, a method of manufacturing a display device 100 according to the present exemplary embodiment includes providing (e.g., forming) a display element layer 120 on a substrate 110 (S100), forming a thin film encapsulation layer 130 covering the display element layer 120 (S200), aging the thin film encapsulation layer 130 (S300), and forming a window 160 (S600).

Referring to FIG. 1 and FIG. 2, step S100 includes forming the display element layer 120 on the substrate 110. Since the substrate 110 is flexible, it may be freely modified, and it may be made of an electrically insulating material with a transparent optical characteristic. For example, the substrate 110 may be made of a transparent polymer material such as polyimide or polyethylene terephthalate, but is not limited thereto.

The display element layer 120 of the present exemplary embodiment includes a plurality of pixels. For example, the plurality of pixels included in the display element layer 120 of the present exemplary embodiment include a blue pixel, a red pixel, and a green pixel. The blue pixel may emit light including, or having, a wavelength of 450 nm, the red pixel may emit light including, or having, a wavelength of 635 nm, and the green pixel may emit light including, or having, a wavelength of 530 nm.

However, the present disclosure is not limited thereto, and a white pixel may be included therein, or a pixel emitting light of a wavelength that is viewed in other colors may be included therein.

In addition, a display element formed in the display element layer 120 may emit light by itself, or may change a wavelength of light transmitted from an external light source L and received by the display element to transmit it. The display element layer 120 may include a transistor layer (not shown) and a semiconductor layer (not shown) for driving the plurality of pixels.

Referring to FIG. 3, in the forming (S200) of the thin film encapsulation layer 130, the thin film encapsulation layer 130 is formed to cover the display element layer 120 to prevent foreign materials or moisture in an external environment from penetrating into the display element layer 120. For example, the thin film encapsulation layer 130 may be formed by depositing a material including an inorganic material such as a SiNx (e.g., SiN, $Si_3N_4$, $Si_2N_3$), and may be formed by alternately stacking organic and inorganic materials a plurality of times.

In the drawings, it is shown that the thin film encapsulation layer 130 is formed only on one side of the display element layer 120, but this is schematically shown for better understanding, and the thin film encapsulation layer 130 may be formed to cover all of the surfaces of the display element layer 120 except for the surface of the display element layer 120 contacting the substrate 110.

Referring to FIG. 1 and FIG. 4, step S300 of the present exemplary embodiment, includes aging the thin film encapsulation layer 130. The aging (S300) of the thin film encapsulation layer 130 is a process of exposing the thin film encapsulation layer 130 to light emitted from a light source L emitting artificial sunlight for a predetermined period of time in order to artificially age the thin film encapsulation layer and form an aged thin film encapsulation layer.

As described above, the artificial sunlight used for aging is artificial light generated by the light source L (see FIG. 4). However, this light is an imitation of natural sunlight, and includes all of the wavelength regions of natural light, such as infrared light, visible light, and ultraviolet light. The artificial sunlight may also include electromagnetic waves having various wavelengths which are present in natural sunlight.

During the aging (S300), inter-atomic bonding of materials included in the thin film encapsulation layer 130 may be changed. This will be described later in detail with reference to FIG. 13.

As shown in FIG. 5, an aged thin film encapsulation layer 130', which is a thin film encapsulation layer deformed by changing the physical properties of the thin film encapsulation layer 130 during the aging (S300), is formed. The physical properties of the aged thin film encapsulation layer 130' will be described in detail later with reference to FIG. 9 to FIG. 15.

Referring to FIG. 1 to FIG. 6, step S400 of forming a touch unit 140 is performed. The touch unit 140 of the present exemplary embodiment may be directly formed (e.g., disposed) on the aged thin film encapsulation layer 130'. Specifically, the touch unit 140 includes a plurality of electrodes made of a conductive material, and converts a touch operation transmitted from the outside (e.g., by a user) into an electrical signal to transmit the touch to the display device.

Referring to FIG. 1 and FIG. 7, as described above, step S500 of forming an insulating layer 150 is performed. Referring to FIG. 7, the insulating layer 150 for protecting the touch unit 140 is formed on the touch unit 140. Although the insulating layer 150 shown in FIG. 7 is shown as a single layer, this is merely an example, and although not shown, a plurality of insulating layers 150 stacked on one another may be used.

Referring to FIG. 1 and FIG. 8, step S600 of forming (e.g., disposing) the window 160 is performed. Referring to FIG. 8, the window 160 for protecting the display element layer 120 and the aged thin film encapsulation layer 130' are formed on the aged thin film encapsulation layer 130'. In an exemplary embodiment, the formation of the window 160 on the thin film encapsulation layer 130' results in a structure in which the window 160 and the thin film encapsulation layer 130' are disposed to be directly adjacent to each other and in contact with each other. As shown in FIG. 8, in another exemplary embodiment, in the display device 100 including the touch unit 140 and the insulating layer 150, the window 160 is formed on the insulating layer 150, thus the touch unit 140 and the insulating layer 150 may be formed between the aged thin film encapsulation layer 130' and the window.

Although not shown, a polarization unit (not shown) may be further included between the window 160 and the aged thin film encapsulation layer 130', but is not limited to this configuration. In addition, the polarization unit may be included in the display element layer 120 or may be included in another position.

Alternatively, although not shown, a step of aging the thin film encapsulation layer 130 using artificial sunlight in advance during the manufacturing process and then correcting a transmittance increase of only light of a blue-based wavelength may be further performed. When the correction step is further performed, it is possible to prevent a color difference from being generated even when a user uses the display device 100 outdoors for a long period of time.

An example of a method of correcting transmittance of the light of the blue-based wavelength may be a method of electrically controlling driving of a blue pixel, or of controlling an emission amount of the light by using a color filter, a polarization unit, or the like, but is not limited thereto, and various methods of correcting transmittance are possible.

According to the present exemplary embodiment, optical characteristics such as transmittance, a refractive index, and an extinction coefficient of the thin film encapsulation layer 130 are changed by the aging process. Specifically, after the aging process, the transmittance of the aged thin film encapsulation layer 130' according to the present exemplary embodiment at a wavelength of 450 nm, is increased by about 5% to about 10% as compared with a transmittance of the thin film encapsulation layer 130 before the aging process. In addition, after the aging process, the refractive index of aged the thin film encapsulation layer 130' at the wavelength of 450 nm, is decreased by about 0.02 to about 0.10 as compared with the refractive index of the thin film encapsulation layer 130 before the aging process. Further, after the aging process, the extinction coefficient of the thin film encapsulation layer 130' at the wavelength of 450 nm, is decreased by a about 0.0001 to about 0.0010 as compared with the extinction coefficient of the thin layer encapsulation layer 130 before the aging process. This will be described more specifically below with reference to graphs shown in FIG. 9 to FIG. 11.

Figure 9:
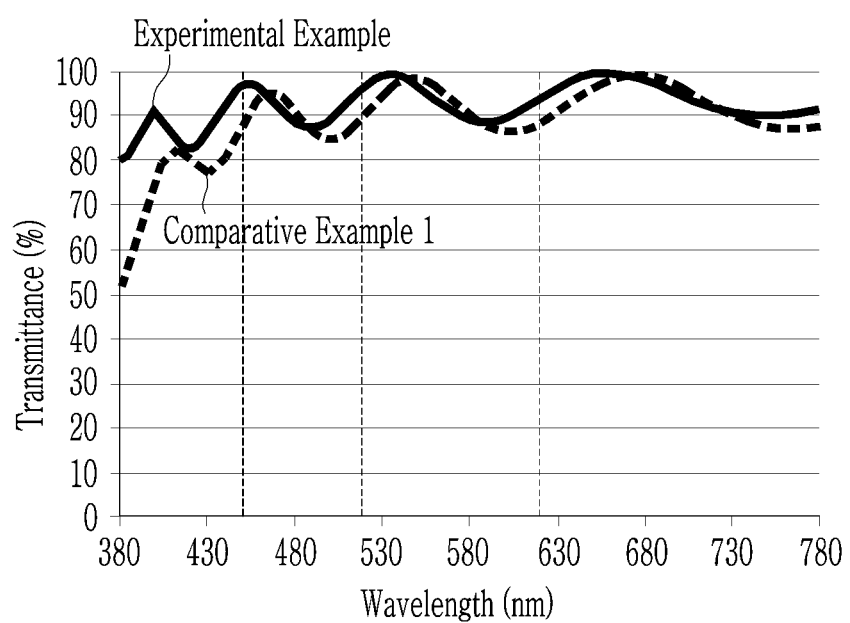
FIG. 9 is a graph of transmittance (%) versus wavelength (nm), of an Experimental example display device including a thin film encapsulation layer which has been aged according to an exemplary embodiment and a Comparative Example 1 display device including a thin film encapsulation layer not having been aged.
Figure 10:
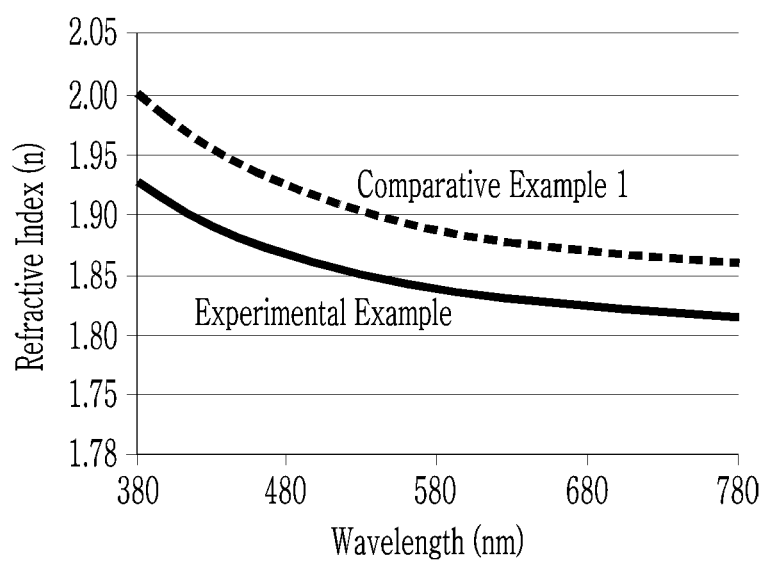
FIG. 10 is a graph of refractive index versus wavelength (nm) of an Experimental example display device including a thin film encapsulation layer which has been aged according to an exemplary embodiment and a Comparative Example 1 display device including a thin film encapsulation layer which has not been aged.
Figure 11:
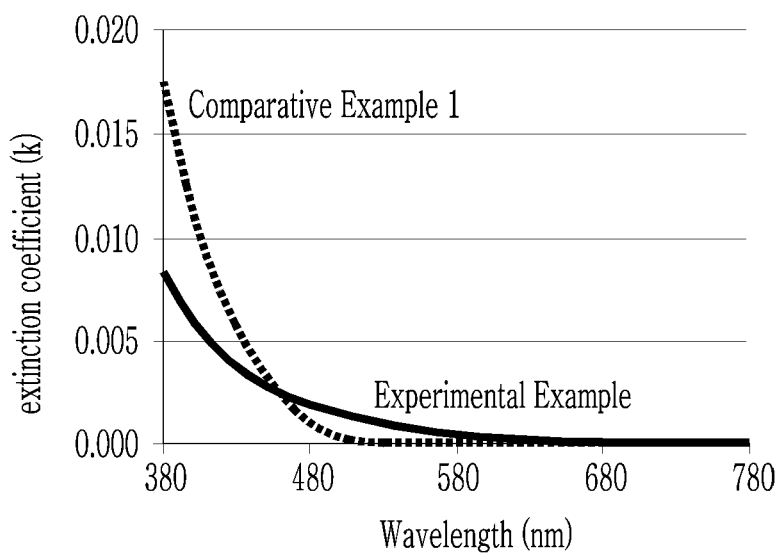
FIG. 11 is a graph of extinction coefficient versus wavelength (nm) of an Experimental example display device including a thin film encapsulation layer which has been aged according to an exemplary embodiment and a Comparative Example 1 display device including a thin film encapsulation layer which has not been aged.

FIG. 9 to FIG. 11 are graphs comparing transmittance, a refractive index, and an extinction coefficient of the display device 100 including the aged thin film encapsulation layer 130' aged according to the present exemplary embodiment (Experimental example) and the display device 100 including a thin film encapsulation layer 130 which has not been aged (Comparative Example 1).

FIG. 9 is a graph comparing transmittance of the Experimental example with respect to the display device including the aged thin film encapsulation layer 130' and of Comparative Example 1 with respect to the display device 100 including the thin film encapsulation layer 130 which has not been aged. FIG. 10 is a graph comparing a refractive index of the Experimental example with respect to the display device 100 including the aged thin film encapsulation layer 130' and Comparative Example 1 with respect to the display device 100 including the thin film encapsulation layer 130 which has not been aged. FIG. 11 is a graph comparing an extinction coefficient of the Experimental example with respect to the display device 100 including the aged thin film encapsulation layer 130' and Comparative Example 1 with respect to the display device 100 including the thin film encapsulation layer 130 which has not been aged.

The Experimental example including the aged thin film encapsulation layer 130' according to the present exemplary embodiment, for example, includes the aged thin film encapsulation layer 130' irradiated with a light source L, 35 times in total, at total energy of 2100 joules per square centimeter (J/cm$^2$) and illuminance of 1620 milliwatts per square centimeter (mW/cm$^2$), and for 38 seconds per time. The material for the thin film encapsulation layer is SiNx.

As shown in FIG. 10, a refractive index of light having a blue-based wavelength including light of a wavelength of 450 nm is not greatly different from the refractive indexes of light having a green-based wavelength including light of a wavelength of 530 nm and light having a red-based wavelength including light of a wavelength of 635 nm.

However, referring to FIG. 9, when comparing transmittance of the Experimental Example and Comparative Example 1, it can be seen that a difference in transmittance of light having a blue-based wavelength including light of a wavelength of 450 nm is relatively greater than differences in transmittance of light having a green-based wavelength including light of a wavelength of 530 nm and of light having a red-based wavelength including light of a wavelength of 635 nm.

Referring to FIG. 11, in extinction coefficients, it can be seen that an extinction coefficient of light having a blue-based wavelength including light of a wavelength of 450 nm is reduced for the Experimental example as compared with Comparative Example 1. However, the extinction coefficients of light having a green-based wavelength including light of a wavelength of 530 nm and of light having a red-based wavelength including light of a wavelength of 635 nm is almost the same for the Experimental example as Comparative Example 1.

The transmittance, the refractive index, and the extinction coefficient described above for the blue-based wavelength including light of a wavelength of 450 nm, and a measured thickness of the Experimental example and Comparative Example 1, are numerically shown in Table 1.

TABLE 1

| At 450 nm | Transmittance (%) | Refractive index (n) | Extinction coefficient (k) | Thickness (Å) |
|---|---|---|---|---|
| Comparative Example 1 | 88.4 | 1.941 | 0.0033 | 7239 |
| Experimental Example | 96.6 | 1.881 | 0.0029 | 7231 |
| Δ (difference) | 8.3 | −0.061 | −0.0004 | −8 |

Referring to Table 1, although not shown in the accompanying drawings, it can be seen that there is a thickness difference between the thin film encapsulation layer 130 and the aged thin film encapsulation layer 130'. Without being limited by theory, it is believed that the thickness difference is dependent on the presence or absence of the aging process. As shown in Table 1, the Experimental example, through the aging process according to the process conditions described above, was reduced in thickness by 8 Å as compared with Comparative Example 1 not having undergone the aging process. However, the present disclosure is not limited thereto, and the thickness of the aged thin film encapsulation layer 130' prepared by the aging process according to the present exemplary embodiment, may be reduced by about 5 Å to about 10 Å compared to the thickness of the thin film encapsulation layer 130 not having undergone the aging process (e.g., before the aging process).

If the thin film encapsulation layer 130 is not aged beforehand using solar light during the manufacturing process thereof, as in the present exemplary embodiment, when a user uses the display device 100 outdoors, the transmittance of light having a wavelength near the wavelength of 450 nm (as shown in FIG. 9) and the extinction coefficient of light having a wavelength near the wavelength of 450 nm (as shown in FIG. 11) are slowly changed due to exposure to natural sunlight. As described above, the transmittance and the extinction coefficient are not greatly changed at the red-based and the green-based wavelengths, while the transmittance is increased or the extinction coefficient is decreased at the blue-based wavelength, and as a result, the color difference of the display device 100 occurs.

Figure 12:
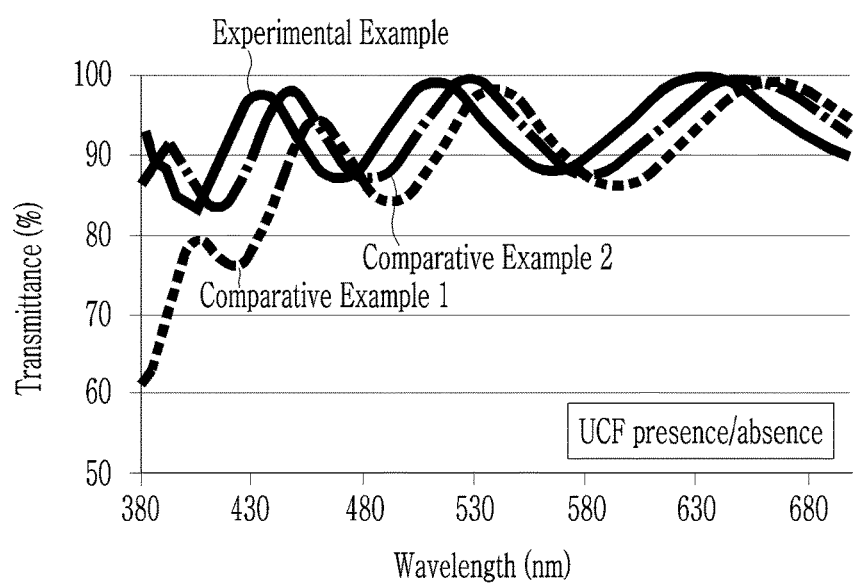
FIG. 12 illustrates the graph of FIG. 9 and further including transmittance of Comparative Example 2, display device including a thin film encapsulation layer aged using an artificial sunlight light source in which an ultraviolet light cutoff filter (UV-Cutoff Filter, UCF) is additionally provided in FIG. 9.

Based on the graph shown in FIG. 9, the graph shown in FIG. 12 additionally includes transmittance of Comparative Example 2. Comparative Example 2 includes an aged thin film encapsulation layer that is aged by an artificial sunlight light source L provided with an ultraviolet light cutoff filter (UV-Cutoff Filter, UCF).

Referring to FIG. 12, it can be seen that Comparative Example 2 has similar transmittance to that of the Experimental example at the wavelength of 450 nm. In addition, when Comparative Example 1 and Comparative Example 2 are compared, it can be seen that a transmittance difference between Comparative Example 1 and Comparative Example 2 at the wavelength of 450 nm, is greater than a transmittance difference between them at the wavelength of 530 nm or between them at the wavelength of 635 nm. This result corresponds to the previously described analysis with respect to the Experimental example and Comparative Example 1 in FIG. 9.

The analysis with respect to Comparative Example 2, is one in which the aging process is performed in a state in which light emitted from the light source L in an ultraviolet region was blocked while aging the thin film encapsulation layer 130. Therefore, it can be seen from FIG. 12 that the light in the ultraviolet region may be omitted in the aging process of the thin film encapsulation layer 130.

Figure 13:
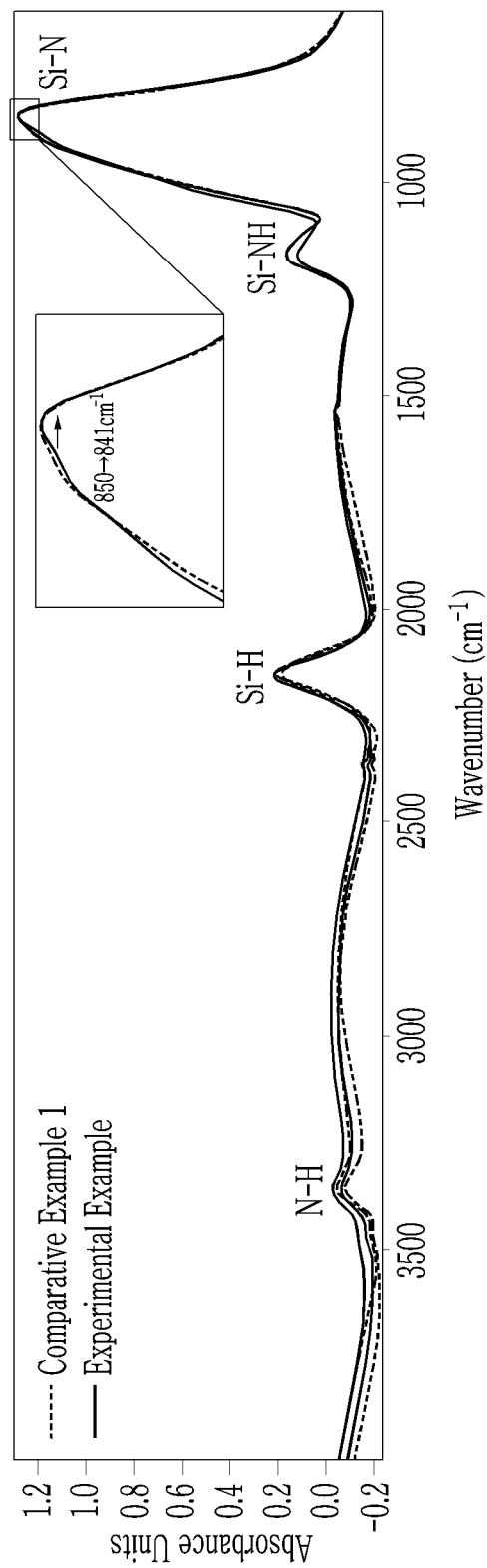
FIG. 13 is a graph of absorbance units versus wavenumber ($cm^{-1}$), showing the results obtained by Fourier transform-infrared spectroscopy (FT-IR) for an Experimental example and Comparative Example 1.
Figure 14:
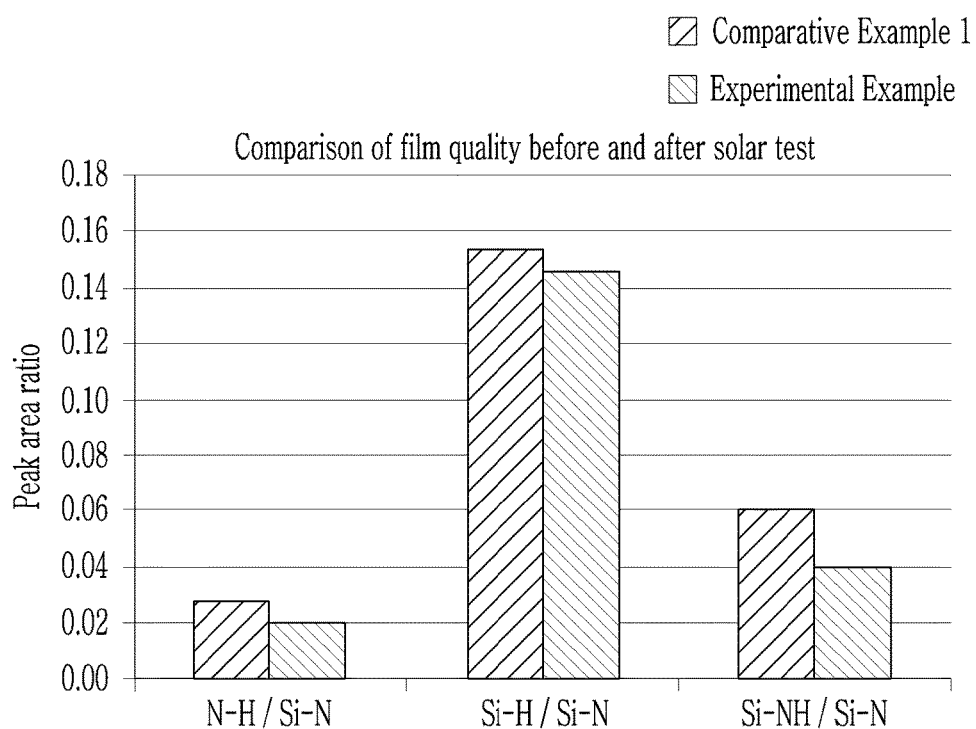
FIG. 14 is a graph of peak area versus bond type, which compares numerical results of a peak areas in the graph shown in FIG. 13.

FIG. 13 is a graph of results obtained by analyzing the Experimental example and the Comparative Example 1 by Fourier transform-infrared spectroscopy (FT-IR), and shows absorbance with respect to a wavenumber for each bond type (e.g., N—H, Si—H, Si—NH, Si—N), and FIG. 14 illustrates a graph comparing numerical results of the peak areas in the graph shown in FIG. 13.

As described above, the thin film encapsulation layer 130 according to the present exemplary embodiment may include a $SiN_x$. The thin film encapsulation layer 130 of the present exemplary embodiment may be formed by a deposition process. Since hydrogen gas is injected into a deposition chamber in which the deposition process is performed, a case in which a material generated by reaction with the $SiN_x$ and the hydrogen gas is deposited as a thin film, or the hydrogen gas is captured in the thin film during the deposition process, may occur. Therefore, the thin film encapsulation layer 130 deposited by using the material including $SiN_x$ may have various bonds such as a N—H bond, a Si—H bond, and a Si—NH bond in addition to a Si—N bond.

Referring to Chemical Formula 1 and Chemical Formula 2, it can be seen that when light energy is applied thereto, rearrangement occurs between bonds between atoms contained in a material.

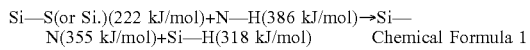

Si—S(or Si.)(222 kJ/mol)+N—H(386 kJ/mol)→Si—N(355 kJ/mol)+Si—H(318 kJ/mol)　　Chemical Formula 1

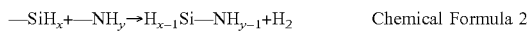

—$SiH_x$+—$NH_y$→$H_{x-1}Si$—$NH_{y-1}$+$H_2$　　Chemical Formula 2

(Obtained from Nuclear Instruments and Method in Physics. Res. B, vol. 116, 1996, p. 355)

Without being limited by theory, it is believed that the optical characteristics of the aged thin film encapsulation layer 130', which is aged with the light energy, are changed due to the rearrangement of the bonds between the atoms. It was confirmed that the optical characteristics of the aged thin film encapsulation layer 130' were changed by the aging process, as shown in FIG. 9 to FIG. 12 and in Table 1. Hereinafter, by analyzing experimental results it may be determined whether or not the rearrangement of the bonds between the atoms has occurred, and accordingly, a cause for the change in the optical characteristics of the thin film encapsulation layer 130' may be confirmed.

FIG. 13 is a graph of the analysis results obtained by Fourier transform-infrared spectroscopy for the display device including the thin film encapsulation layer 130 not aged in the aging process (Comparative Example 1) and the display device including the aged thin film encapsulation layer 130' aged in the aging process (Experimental example), and the analysis results show the presence or absence of respective inter-atomic bonds as determined. FIG. 14 illustrates a graph numerically comparing the peak area for the peaks in the analysis result of FIG. 13, with a Si—N bond of a $SiN_x$ as a basic (e.g., reference) material. Table 2 shows the same data as the results shown in FIG. 14, and further includes a calculated mean value and standard deviation of a peak area for each bond.

TABLE 2

| | Peak area | | | | | |
|---|---|---|---|---|---|---|
| | N—H/Si—N | | Si—H/Si—N | | Si—NH/Si—N | |
| | Average value (average) | Standard deviation (Std. Dev.) | Average value (average) | Standard deviation (Std. Dev.) | Average value (average) | Standard deviation (Std. Dev.) |
| Comparative Example 1 | 0.0279 | 0.0007 | 0.1543 | 0.0024 | 0.0618 | 0.0014 |
| Experimental Example | 0.0214 | 0.0002 | 0.1468 | 0.0013 | 0.0425 | 0.0004 |

Referring to FIG. 13, FIG. 14, and Table 2, compared with Comparative Example 1 (not aged in the aging process), it can be seen that the peak area of the Si—N bond in the Experimental example (aged in the aging process) is reduced as compared with the peak area of the N—H bond, the Si—H bond, and the Si—NH bond. Therefore, the bonds of the thin film encapsulation layer 130 may be rearranged by the light energy applied in the aging process, thus it can be seen that the optical characteristics of the aged thin film encapsulation layer 130' such as the transmittance, the refractive index, and the extinction coefficient, as shown in FIG. 9 to FIG. 11, are changed.

In particular, the presence of Si—H bonds are associated with a reduction in the transmittance of the deposited thin film. Referring to Table 2 and FIG. 14, the Si—H bonds are reduced by the aging process as described above. Therefore, since the number Si—H bonds are reduced by the aging process, the transmittance of the thin film encapsulation layer 130' aged in the aging process increases to a value which greater the transmittance that of the thin film encapsulation layer 130 that is not aged, as described with reference to FIG. 9 and Table 1.

The manufacturing method of the display device 100 according to the exemplary embodiment of the present disclosure has been described. According to the above-described method of manufacturing the display device 100, in which the thin film encapsulation layer is aged while the manufacturing process of the display device 100 is performed, the display device 100 has the optical characteristics of the aged thin film encapsulation layer 130', so when the display device 100 is actually used, it is possible to prevent the thin film encapsulation layer of the display device 100 from deteriorating and causing a color difference when exposed to natural light. Therefore, it is possible to provide a method of manufacturing the display device 100 that may prevent deterioration of the display device 100 even though it is used outdoors for a long period of time.

Hereinafter, a thin film deposition apparatus 200 (which is a thin film deposition apparatus 200 for applying the above-described manufacturing method of the display device 100) that may age a deposited thin film, after a thin film deposition process of forming the thin film encapsulation layer 130, will be described.

The thin film deposition apparatus 200 of the present exemplary embodiment is configured to deposit a thin film on a substrate, and includes a plurality of chambers. One of the plurality of chambers is an entry and exit chamber 220 corresponding to a passage through which the substrate on which the thin film is deposited enters from outside of the thin film deposition apparatus. Another of the plurality of chambers is a process chamber 210 which is configured to deposit the thin film on the substrate. The process chamber 210 may be a single chamber or may include a plurality of process chambers (i.e., two or more), and a thin film may be deposited several times while passing through the plurality of process chambers 210, resulting in a thin film having a stacked structure.

The description in which a display element layer is formed on the substrate before the substrate is inputted into the thin film deposition apparatus 200, is the same as described above, and so a repeated description will be omitted.

The thin film deposition apparatus 200 according to the present exemplary embodiment includes the light source L. The light source L is coupled to a chamber of the plurality of chambers. For example, the light source may be coupled to the entry and exit chamber 220, the process chamber 210, or a combination thereof, and may be configured to irradiate artificial sunlight onto the thin film deposited on the substrate to age the thin film.

Figure 15:
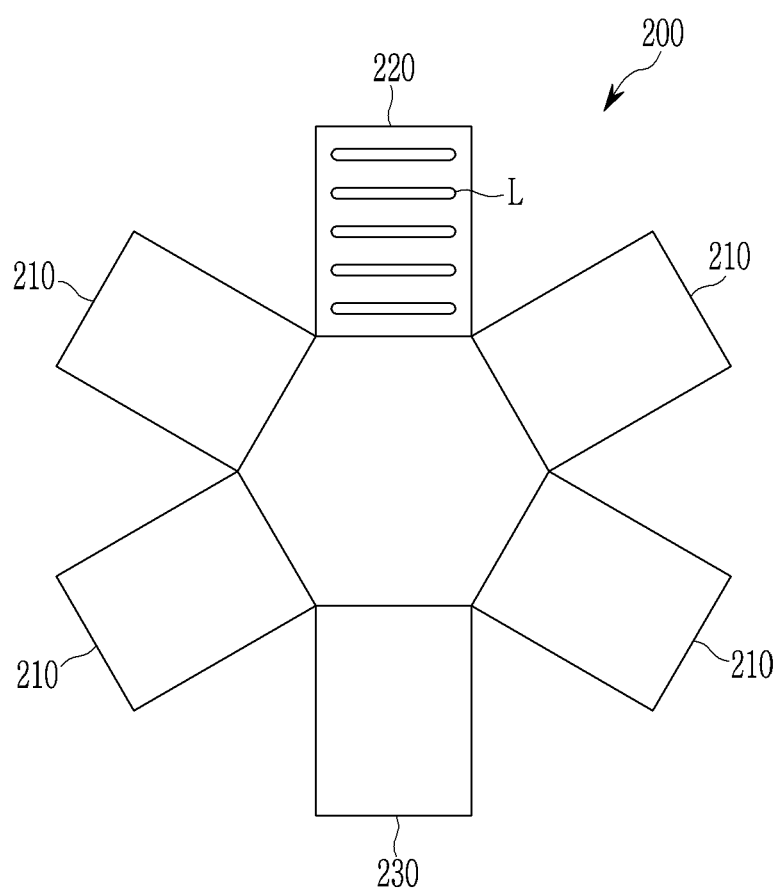
FIG. 15 is a schematic view of a thin film deposition apparatus in which a light source is coupled to an entry and exit chamber according to an exemplary embodiment.

For example, the light source L may be coupled to the entry and exit chamber 220. FIG. 15 illustrates a schematic view of the thin film deposition apparatus 200 in which the light source L is coupled to the entry and exit chamber 220, according to the present exemplary embodiment. Referring to FIG. 15, since the thin film deposition apparatus 200 of the present exemplary embodiment includes the light source L coupled to the entry and exit chamber 220, just before the substrate on which the thin film is completely deposited is released to the outside, it is possible to age the deposited thin film by irradiating light including light having the same wavelength as sunlight onto the thin film.

Figure 16:
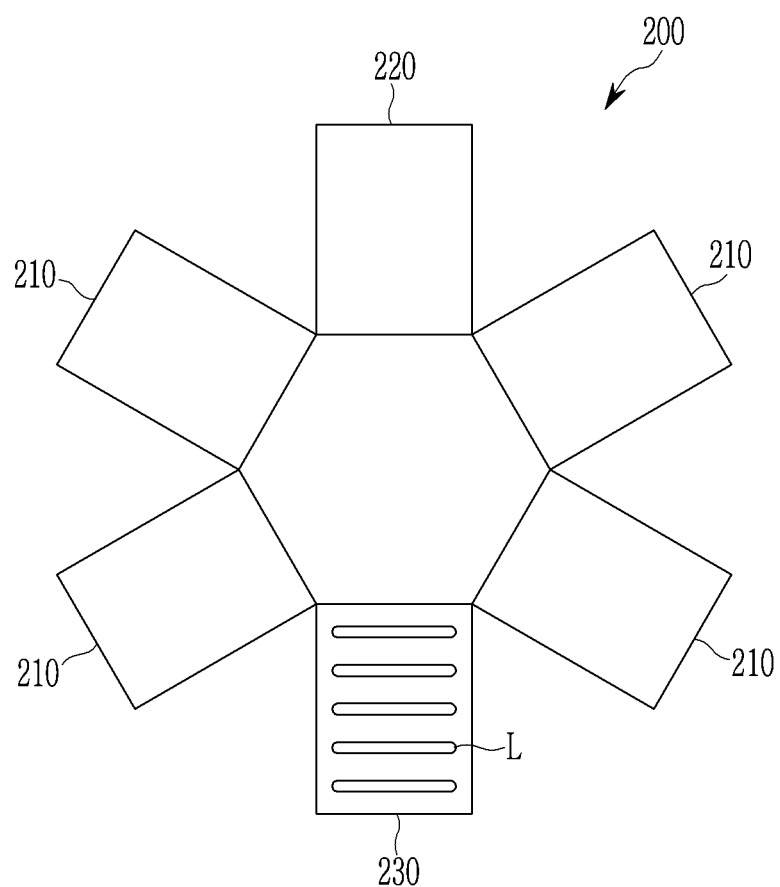
FIG. 16 is a schematic view of a thin film deposition apparatus additionally including an aging chamber according to an exemplary variation.

Alternatively, a thin film deposition apparatus 200 according to an exemplary variation may additionally include a separate aging chamber 230 in which the aging process is performed. FIG. 16 illustrates a schematic view of a thin film deposition apparatus 200 additionally including the aging chamber 230 according to an exemplary variation. Referring to FIG. 16, the thin film deposition apparatus 200 according to the present exemplary variation additionally includes the aging chamber 230. The aging chamber 230 is an additional chamber other than the entry and exit chamber 220 and the process chamber 210 among the plurality of chambers, and the light source L is coupled thereto to perform the aging process. The substrate 110 on which the thin film is completely deposited in the process chamber 210 moves to the aging chamber 230, and may be aged by artificial sunlight irradiated from the light source L.

As described above, the light source L included in the thin film deposition apparatus 200 shown in FIG. 15 and FIG. 16 may emit artificial sunlight including infrared light, visible light, and ultraviolet light.

According to the exemplary embodiment, it is possible to provide a thin film apparatus that may age a deposited thin film without adding an additional separate apparatus to an apparatus in which the thin film deposition process is performed. Therefore, it is possible to perform the aging of the deposited thin film more simply and quickly, thereby providing the display device 100 that may prevent deterioration more economically.

Although the specific exemplary embodiments have been described and illustrated above, the present disclosure is not limited to the exemplary embodiments described herein, and it would be apparent to those skilled in the art that various changes and modifications might be made to these embodiments without departing from the spirit and the scope of the invention. Therefore, the examples and modified examples should not be individually understood to limit the technical spirit or the viewpoint of the present disclosure, and it should be appreciated that modified exemplary embodiments will be included in the appended claims of the present disclosure.

What is claimed is:

1. A method of manufacturing a display device, comprising:
   providing a display element layer on a substrate;
   forming a thin film encapsulation layer covering the display element layer;
   aging the thin film encapsulation layer by using a light source emitting artificial sunlight; and
   disposing a window on the aged thin film encapsulation layer.

2. The method of manufacturing the display device of claim 1, further comprising:
   disposing a touch unit between the aged thin film encapsulation layer and the window; and
   forming an insulating layer covering the touch unit, wherein the insulating layer is disposed between the touch unit and each of the window and the aged thin film encapsulation layer,
   wherein the window is formed on the insulating layer.

3. The method of manufacturing the display device of claim 1, wherein
   the artificial sunlight comprises infrared light, visible light, and ultraviolet light.

4. The method of manufacturing the display device of claim 1, wherein
   the display element layer comprises a plurality of pixels comprising a blue pixel, a red pixel, and a green pixel, and the blue pixel emits light having a wavelength of 450 nanometers.

5. The method of manufacturing the display device of claim 1, wherein
after the aging process, transmittance of the aged thin film encapsulation layer at a wavelength of 450 nanometers is increased by about 5 percent to about 10 percent as compared with a transmittance of the thin film encapsulation layer before the aging process.

6. The method of manufacturing the display device of claim 1, wherein
after the aging process, a refractive index of the aged thin film encapsulation layer at a wavelength of 450 nanometers is reduced by about 0.02 to about 0.10 as compared to a refractive index of the thin film encapsulation layer before the aging process.

7. The method of manufacturing the display device of claim 1, wherein
after the aging process, an extinction coefficient of the aged thin film encapsulation layer at a wavelength of 450 nanometers is reduced by about 0.0001 to about 0.0010 as compared to an extinction coefficient of the thin film encapsulation layer before the aging process.

8. The method of manufacturing the display device of claim 1, wherein
after the aging process, a thickness of the aged thin film encapsulation layer at a wavelength of 450 nanometers is reduced by about 5 angstroms to about 10 angstroms as compared to a thickness of the thin film encapsulation layer before the aging process.

9. The method of manufacturing the display device of claim 1, wherein
the thin film encapsulation layer comprises a $SiN_x$.

10. The method of manufacturing the display device of claim 9, wherein
in the aged thin film encapsulation layer, a peak area of a N—H bond as measured by Fourier transform-infrared spectroscopy is reduced as compared with a peak area of a Si—N bond.

11. The method of manufacturing the display device of claim 9, wherein
in the aged thin film encapsulation layer, a peak area of a Si—NH bond as measured by Fourier transform-infrared spectroscopy is reduced as compared with a peak area of a Si—N bond.

12. The method of manufacturing the display device of claim 9, wherein
n the aged thin film encapsulation layer, a peak area of a Si—NH bond as measured by Fourier transform-infrared spectroscopy is reduced as compared with a peak area of a Si—N bond.

13. The method of manufacturing the display device of claim 1, wherein
after the aging process, transmittance of the aged thin film encapsulation layer at a wavelength of 450 nanometers is increased as compared with a transmittance of the thin film encapsulation layer before the aging process.

14. The method of manufacturing the display device of claim 1, wherein
after the aging process, a refractive index of the aged thin film encapsulation layer at a wavelength of 450 nanometers is reduced as compared to a refractive index of the thin film encapsulation layer before the aging process.

15. The method of manufacturing the display device of claim 1, wherein
after the aging process, an extinction coefficient of the aged thin film encapsulation layer at a wavelength of 450 nanometers is reduced as compared to an extinction coefficient of the thin film encapsulation layer before the aging process.

16. The method of manufacturing the display device of claim 1, wherein
after the aging process, a thickness of the aged thin film encapsulation layer at a wavelength of 450 nanometers is reduced as compared to a thickness of the thin film encapsulation layer before the aging process.

17. The method of manufacturing the display device of claim 1, wherein the thin film encapsulation layer comprises a $SiN_x$, and the aged thin film encapsulation layer comprises a N—H bond, a Si—H bond, a Si—NH bond, and a Si—N bond.

18. A method of manufacturing a display device, comprising:
providing a display element layer on a substrate;
forming a thin film encapsulation layer covering the display element layer;
aging the thin film encapsulation layer by using a light source emitting artificial sunlight; and
disposing a window on the aged thin film encapsulation layer,
wherein the thin film encapsulation layer comprises a $SiN_x$, and
wherein in the aged thin film encapsulation layer, a peak area of a Si—H bond as measured by Fourier transform-infrared spectroscopy is reduced as compared with a peak area of a Si—N bond.

* * * * *